United States Patent [19]
Jacob

[11] Patent Number: 5,796,486
[45] Date of Patent: Aug. 18, 1998

[54] APPARATUS METHOD FOR DETERMINING THE PRESENCE OR ABSENCE OF A WAFER ON A WAFER HOLDER

[75] Inventor: David E. Jacob, Fremont, Calif.

[73] Assignee: LAM Research Corporation, Fremont, Calif.

[21] Appl. No.: 832,621

[22] Filed: Mar. 31, 1997

[51] Int. Cl.⁶ .................. G01B 11/14; B05C 11/00; B65G 49/07; H01J 40/14
[52] U.S. Cl. .................. 356/375; 250/548; 250/559.12; 250/22.1; 118/675; 118/676; 414/936
[58] Field of Search .................. 356/375; 250/559.12, 250/548, 222.1; 118/663, 668, 675–676; 414/935–937

[56] References Cited

U.S. PATENT DOCUMENTS

| | | | |
|---|---|---|---|
| 3,902,615 | 9/1975 | Levy et al. | 250/548 |
| 3,972,424 | 8/1976 | Levy et al. | 414/783 |
| 4,713,551 | 12/1987 | Layman et al. | 250/559.12 |
| 5,015,177 | 5/1991 | Iwata | 432/121 |
| 5,240,746 | 8/1993 | Litteral | 427/510 |
| 5,264,918 | 11/1993 | Kagami | 356/150 |
| 5,271,953 | 12/1993 | Litteral | 427/8 |
| 5,370,745 | 12/1994 | Litteral | 118/696 |
| 5,518,542 | 5/1996 | Matsukawa | 414/936 |
| 5,664,254 | 9/1997 | Ohkura et al. | 414/152 |
| 5,686,143 | 11/1997 | Matsukawa et al. | 427/271 |

*Primary Examiner*—David C. Nelms
*Assistant Examiner*—Jason D. Vierra-Eisenberg
*Attorney, Agent, or Firm*—Lowe Hauptman Gopstein & Berner

[57] ABSTRACT

The presence and absence of a semiconductor wafer on a wafer holder in a vacuum chamber having an optically transparent window is detected by an optical system including a source of optical energy positioned outside the chamber and a receiver for the optical energy positioned outside the chamber. A light path extends from the source through the window and an opening in the wafer holder when no wafer is on the wafer holder. The optical path is bent downstream of the wafer holder, thence continues back through another opening in the wafer holder, and through the window to the receiver. The optical receiver is positioned and arranged so optical energy reflected from a wafer (even a wafer having dispersive mirror properties) in situ on the wafer holder cannot be reflected or otherwise incident on the optical receiver. The optical receiver thus has optical energy from the source incident on it when no wafer is present on the wafer holder and no optical energy from the source is incident on the receiver when a wafer is on the wafer holder.

15 Claims, 5 Drawing Sheets

APPARATUS METHOD FOR DETERMINING THE PRESENCE OR ABSENCE OF A WAFER ON A WAFER HOLDER

FIELD OF INVENTION

The present invention relates generally to an apparatus for and method of determining the presence and absence of a semiconductor wafer on a wafer holder in a vacuum chamber and more particularly to such an apparatus and method wherein optical energy is transmitted into and received outside the chamber via an optical path that extends through a chamber window and the wafer holder and bends downstream of the wafer holder back to a detector when a wafer is not in place on the holder.

BACKGROUND ART

Vacuum chambers for workpieces, particularly wafers used in semiconductor manufacture, usually include a workpiece holder. In a vacuum load lock chamber, the workpiece holder transports the wafer between a vacuum processing chamber and cassette at atmospheric pressure. In a vacuum processing chamber the wafer is delivered to a stationary wafer holder.

It is necessary to signal when a workpiece is properly positioned on workpiece holders in vacuum load locks. Some of the prior art techniques used to determine the presence and absence of workpieces on workpiece holders in vacuum chambers have involved providing the chamber with an optically transparent window and mounting an optical transmitter and receiver on or in proximity to the window. Such arrangements are advantageous because the optical transmitter, i.e., source, and receiver are outside the vacuum chamber. Accordingly, the optical source and receiver do not interfere with operations occurring within the sealed vacuum chamber, do not outgas possible workpiece contaminating particles into the chamber, and are not subject to the possibly deleterious, corroding environment inside the chamber. As a result, costly downtime of the vacuum chamber is reduced.

In one such arrangement the optical transmitter emits a beam of optical energy that propagates obliquely through the window to the workpiece holder. When no workpiece is on the holder, the beam is incident on a reflector fixedly mounted on the workpiece holder, in a flange for supporting the workpiece. The reflector is oriented so the optical beam incident on it is reflected back to the receiver via a path virtually identical to the path from the transmitter to the reflector. When a workpiece is on the holder, the beam is supposed to be reflected so its angle of incidence and reflection are the same. Thereby, no optical energy is incident on the receiver when a workpiece is on the holder.

A problem with this prior art arrangement is that some semiconductor wafers in the vacuum chamber have patterns that substantially duplicate the reflecting properties of the reflector mounted on the workpiece holder flange. When such a wafer is on the workpiece holder, optical energy in the beam from the transmitter is reflected back to the optical receiver, causing the optical receiver to generate a signal falsely indicating that no wafer is on the workpiece holder obviously, this prior art arrangement cannot be used to detect the presence and absence of such wafers on the workpiece holder. In load lock wafer holders, the false signal indicates a wafer is on the holder when this is not the case, to reduce wafer throughput in a vacuum system including the load lock. Catastrophic results can also occur in response to the false indication because a wafer on the holder is likely to be broken by a wafer transfer mechanism moving another wafer to the process chamber while a wafer is actually in the process chamber.

In another optical detecting arrangement, a laser emits a highly collimated beam which is directed to be incident on an edge of a wafer that is properly in place on the workpiece holder. The wafer edge reflects the laser beam back to a detector via a path that is virtually coincident with the path from the laser to the edge. When no wafer is on the workpiece holder, no reflection occurs and no optical energy from the laser is incident on the detector. While this arrangement is extremely reliable, it is quite expensive because of the laser cost.

It is, accordingly, an object of the present invention to provide a new and improved method of and apparatus for optically detecting the presence and absence of workpieces on workpiece holders in vacuum chambers.

Another object of the invention is to provide a new and improved method of and inexpensive apparatus for reliably optically detecting the presence and absence of a wafer used in semiconductor manufacture on a workpiece holder in a vacuum chamber.

SUMMARY OF THE INVENTION

In accordance with one aspect of the invention an apparatus for determining the presence and absence of a wafer on a wafer holder in a vacuum chamber having a sealed optically transparent window comprises a source of optical energy positioned outside the chamber, a receiver for the optical energy positioned outside the chamber and a light path extending from the source through the window and through the wafer holder when no wafer is on the wafer holder. The optical path extends back to the receiver through the window by being bent downstream of the wafer holder. The optical receiver is positioned and arranged so optical energy from the source reflected from a wafer on the wafer holder is not incident on the optical receiver. The optical receiver thereby has optical energy from the source incident on it only when a wafer is not present in the wafer holder.

In certain preferred embodiments the optical path includes first and second reflecting surfaces. The first reflecting surface is positioned to intercept optical energy from the source that propagates through the wafer holder when no wafer is present on the wafer holder and reflects the optical energy incident thereon to the second reflecting surface. The second reflecting surface reflects optical energy incident thereon from the first reflecting surface through the window to the optical receiver. To minimize size requirements of the optical path and assist in establishing a non-dispersive optical path the first and second reflecting surfaces are positioned so the optical path extends below the wafer holder along a line extending parallel to a plane including the window and each of the optical surfaces is tilted 45° with respect to the optical energy incident thereon.

To minimize costs each of the optical reflecting surfaces is included in a mirror, but it is to be understood each of the reflecting surfaces can be included in a prism. Alternatively, the optical path includes a fiber optic transmission line having an input face positioned downstream of the wafer holder to be responsive to optical energy (a) emitted from the source, (b) propagated through the window and (c) propagated through the wafer holder. The fiber optic transmission line has an output face positioned to couple optical energy propagating through the fiber optic line to the receiver via the window.

To minimize size and expense the transmitter and receiver are mounted in substantially the same plane adjacent the window in a single housing.

Another aspect of the invention is directed to a method of determining the presence and absence of a wafer on a wafer holder in a vacuum chamber including a sealed window transparent to optical energy, wherein the method comprises transmitting a beam of optical energy originating outside the chamber through the window. When no wafer is on the wafer holder the beam is transmitted through the window and the wafer holder, and bent downstream of the wafer holder, so it propagates through the window to an optical receiver positioned outside the chamber. The optical receiver responds to the optical energy incident on it to signal that the wafer is not present on the optical holder. When a wafer is present on the wafer holder, the beam is interrupted by the wafer on the wafer holder so the beam does not propagate through the wafer holder and is not reflected or otherwise propagated to the optical receiver. The optical receiver responds to the failure of optical energy of the source to be incident thereon to signal that the wafer is present on the wafer holder.

DESCRIPTION OF THE PREFERRED EMBODIMENT

Figure 1:
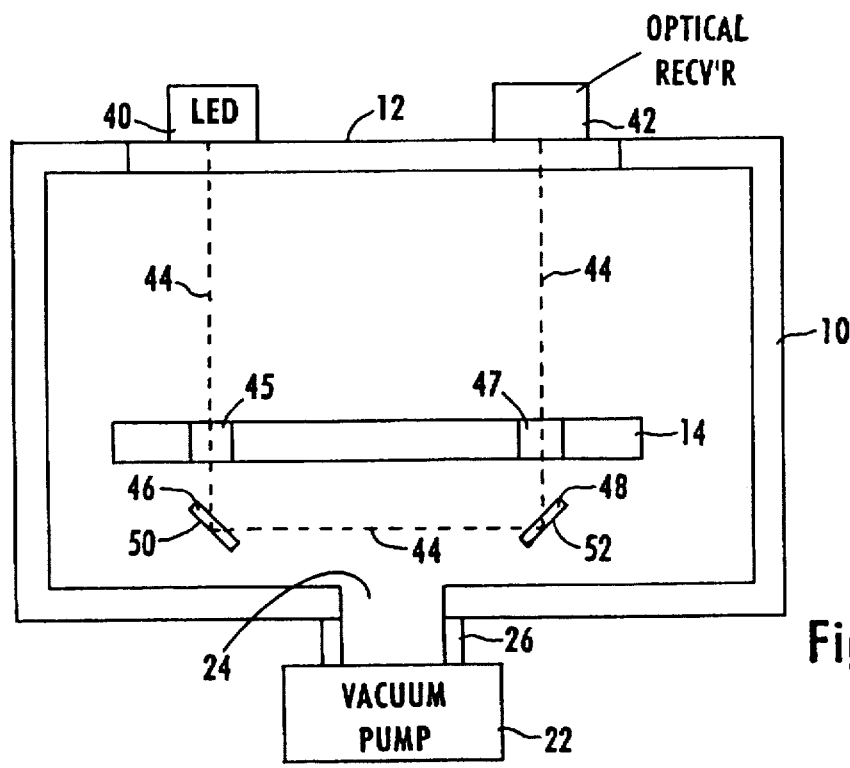
FIG. 1 is a side schematic diagram of an optical wafer detector in accordance with a preferred embodiment of the present invention.

Reference is now made to FIG. 1 of the drawing, wherein vacuum chamber 10 includes sealed optically transparent substantially horizontally extending, clear Lexan planar window 12 and workpiece holder 14. Workpiece holder 14 is positioned in vacuum chamber 10 such that the workpiece holder lies in a substantially horizontal plane substantially parallel to the horizontal plane of window 12. Workpiece holder 14 and window 12 are positioned in alignment with each other such that the workpiece holder is directly beneath the window when a determination is made as to whether the wafer is on holder 14. In one embodiment wherein chamber 10 is a load lock between a wafer vacuum processing chamber and a wafer cassette, holder 14 is part of a two part robotic arm, described in connection with FIGS. 4–7. The arm transports the wafers between the wafer processing chamber and the cassette. All of the apparatus described supra in connection with FIG. 1 is old and well known and requires no further description.

The present invention is concerned with determining whether or not a semiconductor wafer is positioned on wafer holder 14. To these ends, optical source, i.e. transmitter or emitter, 40, preferably a red light emitting diode, and optical receiver 42 responsive to the wavelength of source 40 are positioned on window 12 outside chamber 10. Optical detector 42 is positioned and arranged so that if a wafer is positioned on wafer holder 14 there is no optical path from emitter 40 to detector 42 even if a dispersive mirrored surface is positioned on wafer holder 14. To this end, source 40 emits a collimated, vertically extending optical beam and vertically extending blinder plates (not shown) are positioned in receiver 42 immediately upstream of a semiconductor photodetector (not shown) of the receiver.

Optical beam path 44 extends from optical emitter 40 through window 12. When no wafer is present on holder 14, path 44 extends through aperture 45 in wafer holder 14. From aperture 45, path 44 extends below wafer holder 14, thence bends below, i.e. downstream of, the wafer holder. After being bent below wafer holder 14, optical path 44 is again bent and then extends vertically upward through aperture 47 in the wafer holder, back through window 12 to optical receiver 42 so a collimated beam is incident on the receiver photodetector.

In the embodiment of FIG. 1, optical path 44 includes mirrors 46 and 48. Mirror 46 includes metallic planar reflecting surface 50, positioned 45° to the vertical, i.e., 45° with respect to the optical beam propagating vertically from emitter 40 through window 12 and opening 45 in wafer holder 14. Mirror 48 includes metallic (silver) planar reflecting surface 52 positioned 45° from the horizontal and in generally the same horizontal plane as reflecting surface 50. Reflecting surfaces 50 and 52 are coatings on the front side of glass, optically transparent substrates of mirrors 46 and 48. The silver reflecting surfaces are not subject to outgassing and therefore do not contaminate vacuum chamber 10.

Optical path 44 extends horizontally between the planar mirrored surfaces 50 and 52 of mirrors 46 and 48, along a line parallel to the horizontal plane of window 12 and wafer holder 14. Optical path 44 extends vertically from mirrored surface 52 through slot 47 and window 12 to optical receiver 42. Optical path 44 is complete when no wafer is in wafer holder 14. When, however, a wafer is in wafer holder 14, optical path 44 is interrupted and no optical energy from source 40 is incident on optical receiver 42. Consequently the photodetector of the receiver derives relatively high and low signal levels in response to no wafer being on holder 14 and a wafer being on the holder, respectively.

Figure 2:
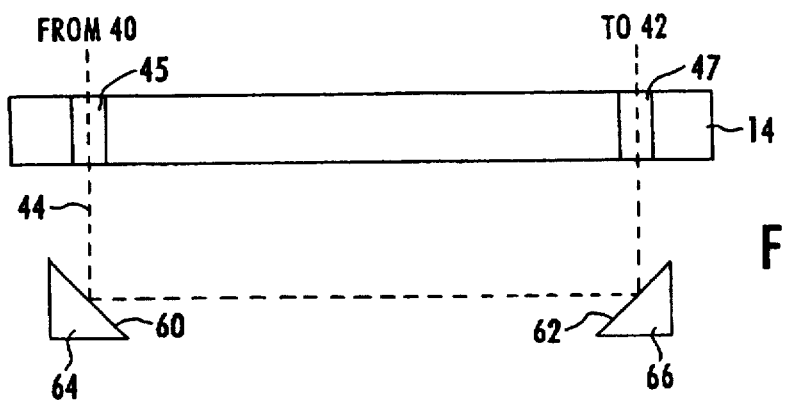
FIG. 2 is a partial side schematic diagram of a further embodiment of the invention using prisms, instead of mirrors.

Reference is now made to FIG. 2 of the drawing, a partial schematic diagram of a further embodiment of the present invention, wherein reflecting surfaces 50 and 52 of mirrors 46 and 48 are respectively replaced by reflecting surfaces 60 and 62 of dielectric prisms 64 and 66. In all other regards, the embodiment of FIG. 2 is identical to that as stated in FIG. 1. While the embodiment of FIG. 2 is functionally very similar to that of FIG. 1, the embodiment of FIG. 2 is more expensive than the mirror embodiment of FIG. 1 because prisms 64 and 66 are more expensive than mirrors 46 and 48.

Figure 3:
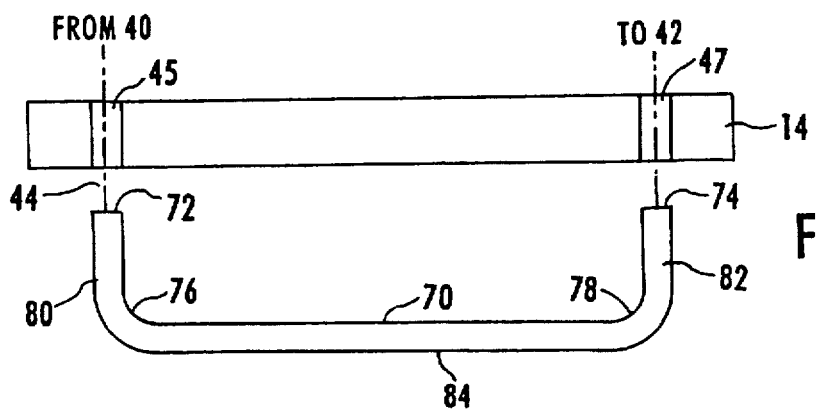
FIG. 3 is a partial side schematic diagram of a further embodiment of the invention wherein an optical path is established by a fiber optic element.
Figure 4:
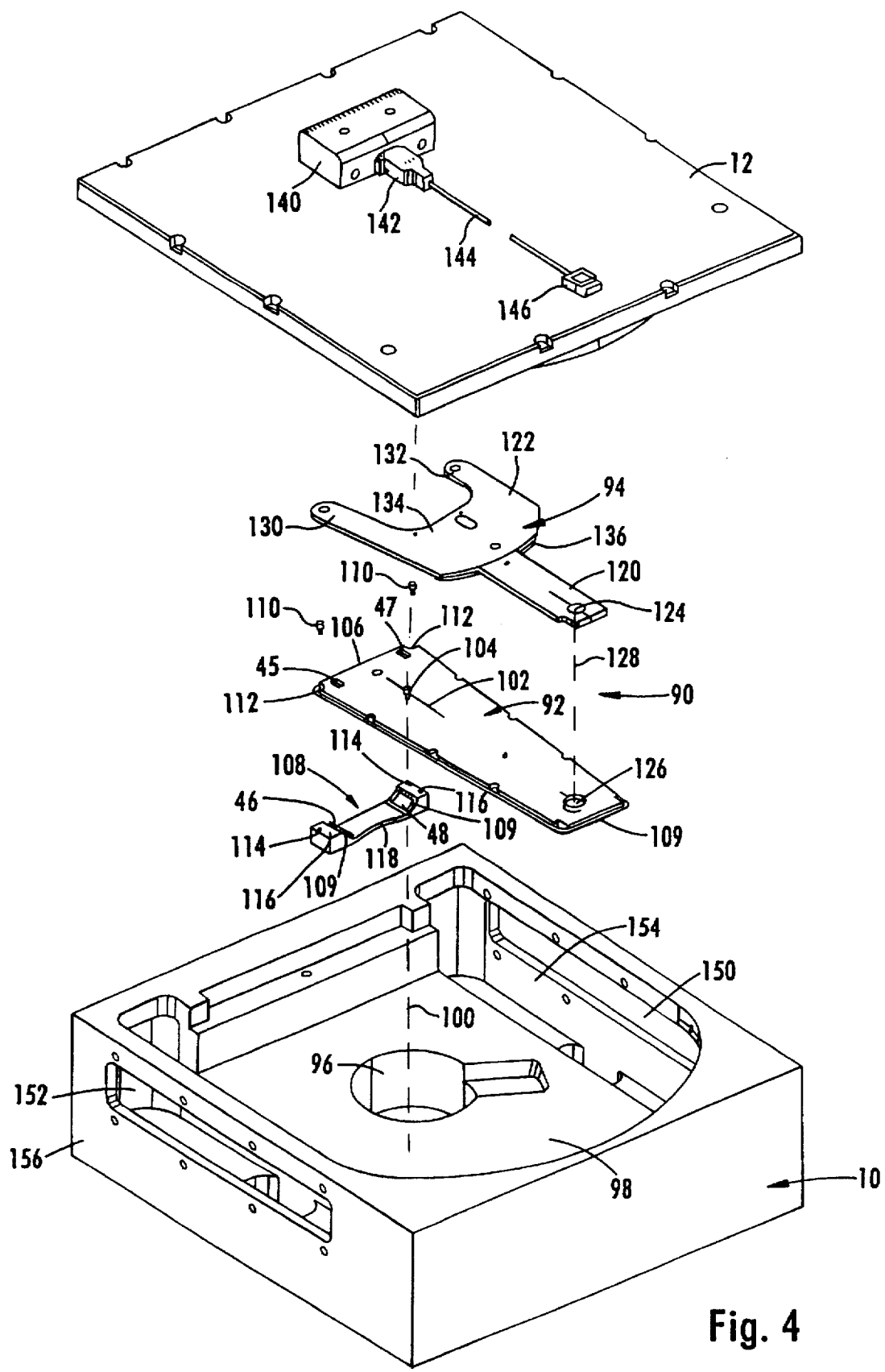
FIG. 4 is an exploded perspective view of a load lock chamber in accordance with the embodiment illustrated in FIG. 1.

Reference is now made to FIG. 3 of the drawing wherein the bent light path downstream of opening 45 in wafer holder 14 of FIG. 1 is replaced by fiber optic transmission line 70 having horizontally extending input and output faces positioned in alignment with openings 45 and 47. Thereby, input face 72 is responsive to the vertically directed optical beam emitted by source 40 while output face 74 supplies an output beam to optical receiver 42. To achieve these results, fiber optic transmission line 70, located in chamber 10, includes bends 76 and 78 between vertically extending portions 80 and 82 and horizontally extending portion 84 thereof. While the fiber optic transmission line arrangement of FIG. 3 is probably more flexible than the mirror arrangement of FIG. 1, the fiber optic transmission line arrangement of FIG. 3 is more expensive than the mirror embodiment of FIG. 1.

In the preferred embodiment, illustrated in FIGS. 4-7, vacuum chamber 10 is a load lock interposed between a vacuum processing chamber and a wafer storing cassette. The wafer processing chamber and cassette are respectively on the right and left sides of load lock chamber 10, as illustrated in FIGS. 4-7. Load lock chamber 10 includes robotic arm 90 comprising lower cover segment 92 and upper wafer holding segment 94, constituting wafer holder 14, FIG. 1. Segment 92 is fixedly mounted on a rotatable shaft (not shown) that extends through bore 96 in base 98 of load lock chamber 10. The shaft has an axis 100 which intersects center line 102 of lower cover segment 92 at point 104 approximately one-third of the length from forward edge 106 to rear edge 109 of segment 92.

Openings 45 and 47, in the form of slots, are located in proximity to the two front corners of lower segment 92. Block 108 includes facing tapered side walls 109, both inclined 45° to the horizontal and which carry mirrors 46 and 48. Block 108 is fixedly mounted to the lower face of lower arm segment 92 by screws 110 that extend through openings 112 at the two front corners of the lower segment. Screws 110 fit into threaded bores 114 on planar upper faces 116 of the mirror block; the planar upper faces abut the lower face of cover segment 92. Tapered side walls 109, to which mirrors 46 and 48 are secured by any suitable means such as screws or adhesive (not shown), are separated from each other by horizontally extending leg 118 so the mirrors are spaced approximately three inches from each other.

One end of upper arm segment 94 includes circular opening 124; tongue 120, having wafer holding hand 122, is at the other end of segment 94. Opening 124 is always aligned with opening 126 adjacent back edge 108 of cover segment 92. Openings 124 and 126 are connected together by a pivot joint (not shown), such that upper segment 94 turns relative to lower cover segment 92 about vertical axis 128 that extends through the centers of both of circular openings 124 and 126. Hand 122 includes fingers 130 and 132 which extend longitudinally in about the same direction as tongue 120. Hand 122 also includes web 134, extending between fingers 130 and 132 on which a wafer rests. The wafer is held in place by flange 136, at the base of the web where the web intersects tongue 120. When the wafer is in place on web 134, abutting flange 136, the wafer completely covers fingers 130 and 132.

Load lock chamber 10 includes and is sealed by Lexan window 12, on which housing 140 is fixedly mounted so the transmitter and receiver are horizontally spaced about three inches from each other. Optical transmitter 40 and optical receiver 42 are fixedly mounted at opposite sides of housing 140 such that when no wafer is located on hand 122 and robotic arm 90 is at the "home" position illustrated in FIG. 6, the collimated optical beam derived from the transmitter propagates through window 12 and slot 45 to mirror 46. Optical receiver 42 in housing 90 is vertically aligned with slot 47 and mirror 48 so the receiver is responsive to optical energy reflected from mirror 48 when no wafer is on hand 22, when the robotic arm 90 is at the "home" position.

Source 40 and receiver 42 in housing 140 are connected by electric connector 142 to one end of electric cable 144, having a second end coupled by electric connector 146 to an energizing source for transmitter 40 and an output device, such as a computer, responsive to the signal derived by receiver 42. The signal derived by receiver 42 indicates whether or not a wafer is on wafer holder 14.

Figure 5:
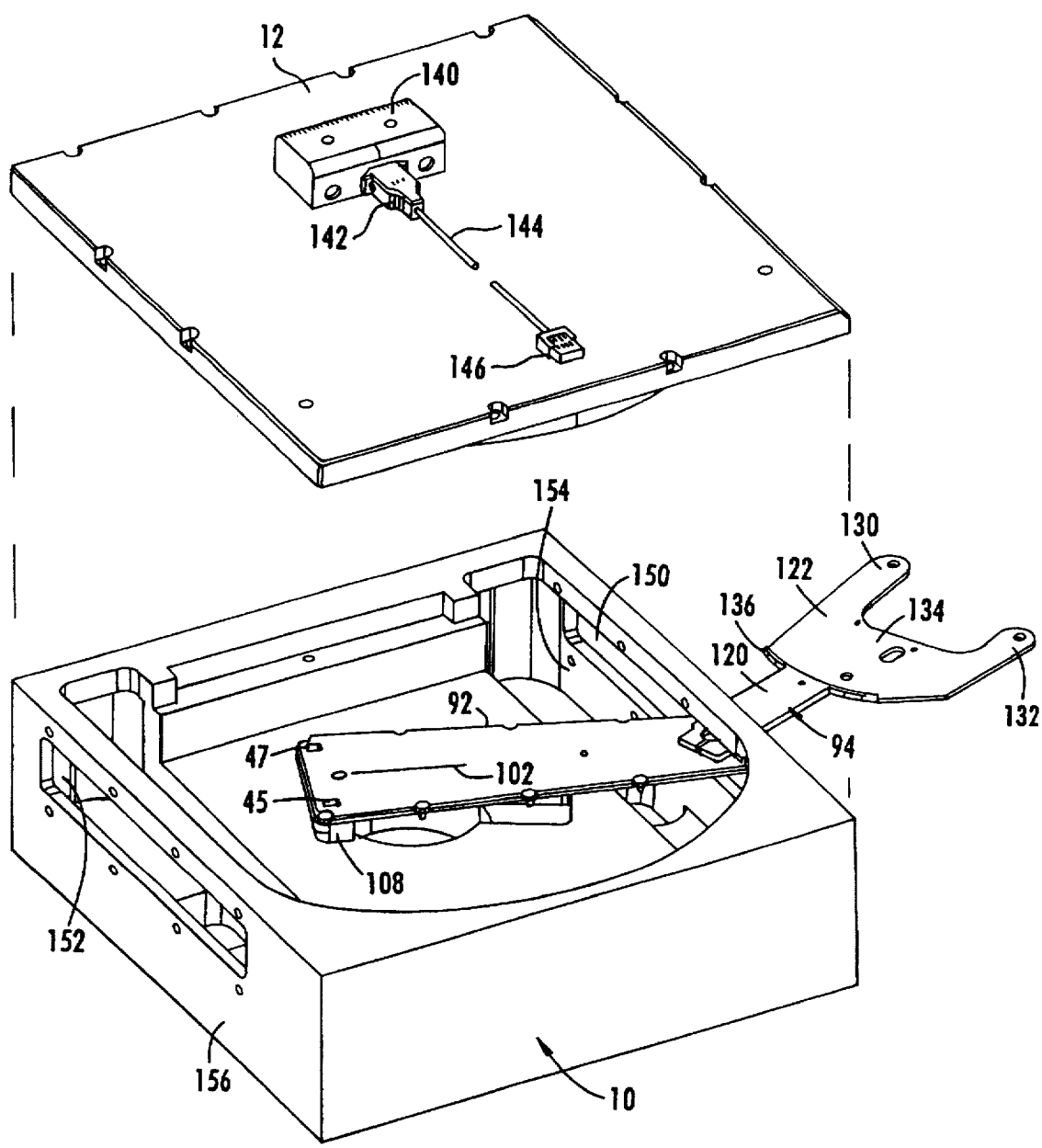
FIGS. 5, 6 and 7 are partially exploded perspective views of the load lock illustrated in FIG. 4 wherein a wafer holder arm is respectively at an inlet of the load lock chamber coupled with a vacuum processor, aligned with a wafer optical transmitter and receiver, and at an inlet of the load lock chamber coupled with a cassette.

To enable robotic arm 90 to transport wafers from the processing chamber to the cassette, load lock chamber 10 includes horizontally extending slots 150 and 152 on its opposite side walls 154 and 156, respectively. When robotic arm 90 begins to move semiconductor wafers from the vacuum processing chamber, as illustrated in FIG. 5, tongue 120 and hand 122 of upper segment 94 are in the processing chamber while axis 128 is in slot 150. Cover segment 92 has been driven about axis 100 at this time so the cover arm extends between axis 100 and slot 150. Signals from a computer are supplied to motors (not shown) to cause segments 92 and 94 to be in the described and illustrated position.

After a wafer has been placed on hand 122 while the hand is in the wafer processing chamber, the hand is driven by a motor through slot 150 into load lock chamber 10 so the longitudinally extending axes of lower segment 92 and upper segment 94 are aligned. Then the motor associated with the shaft which extends through bore 96 turns lower segment 92 about axis 100 until hand 90 is at the "home" position. Then the computer is activated to be responsive to the signal from receiver 44. If the computer is supplied with a high level, an indication is provided that no wafer is on arm 90. If, however, the receiver supplies the computer with a low signal an indication is provided that a wafer is on hand 122.

Figure 6:
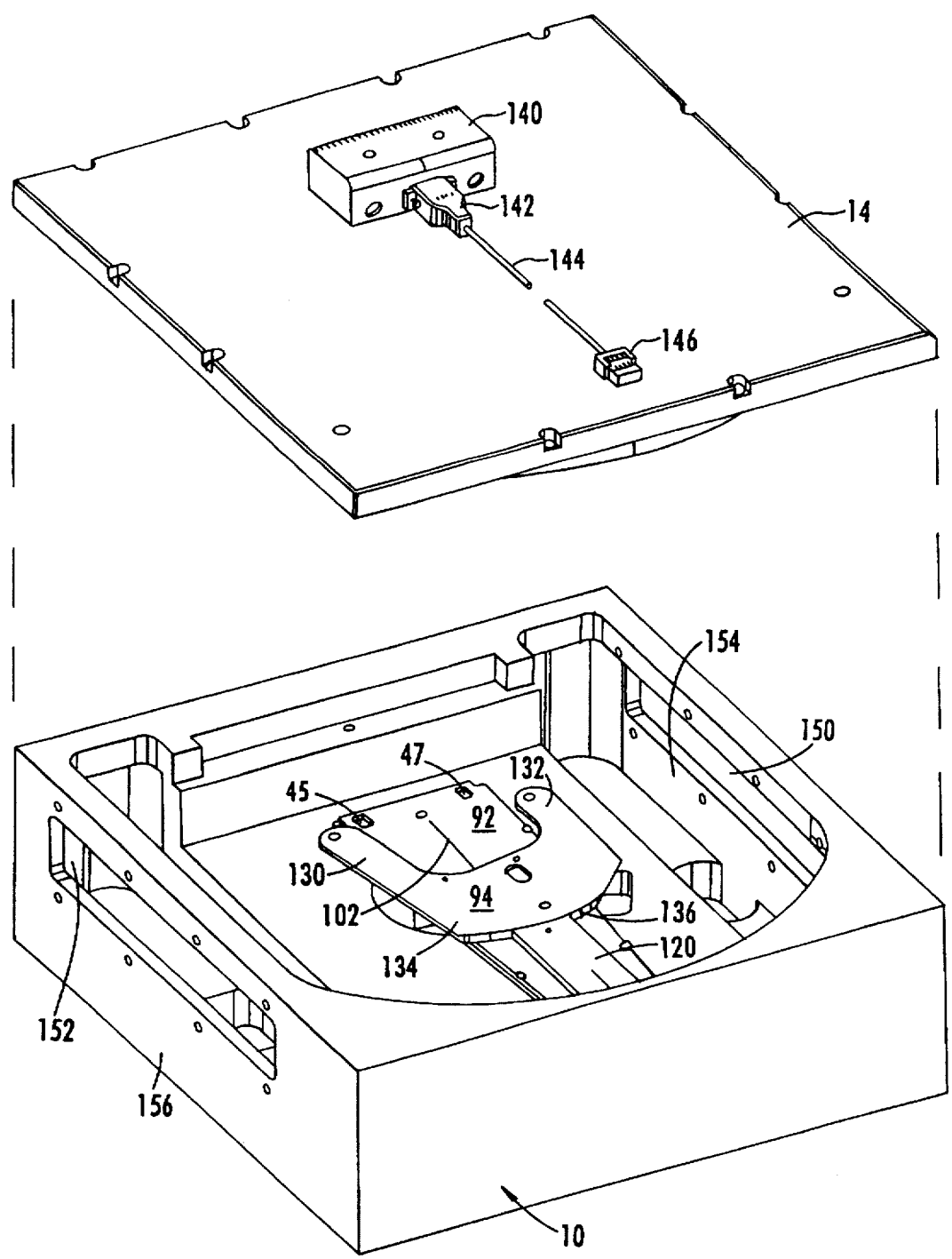
Figure 7:
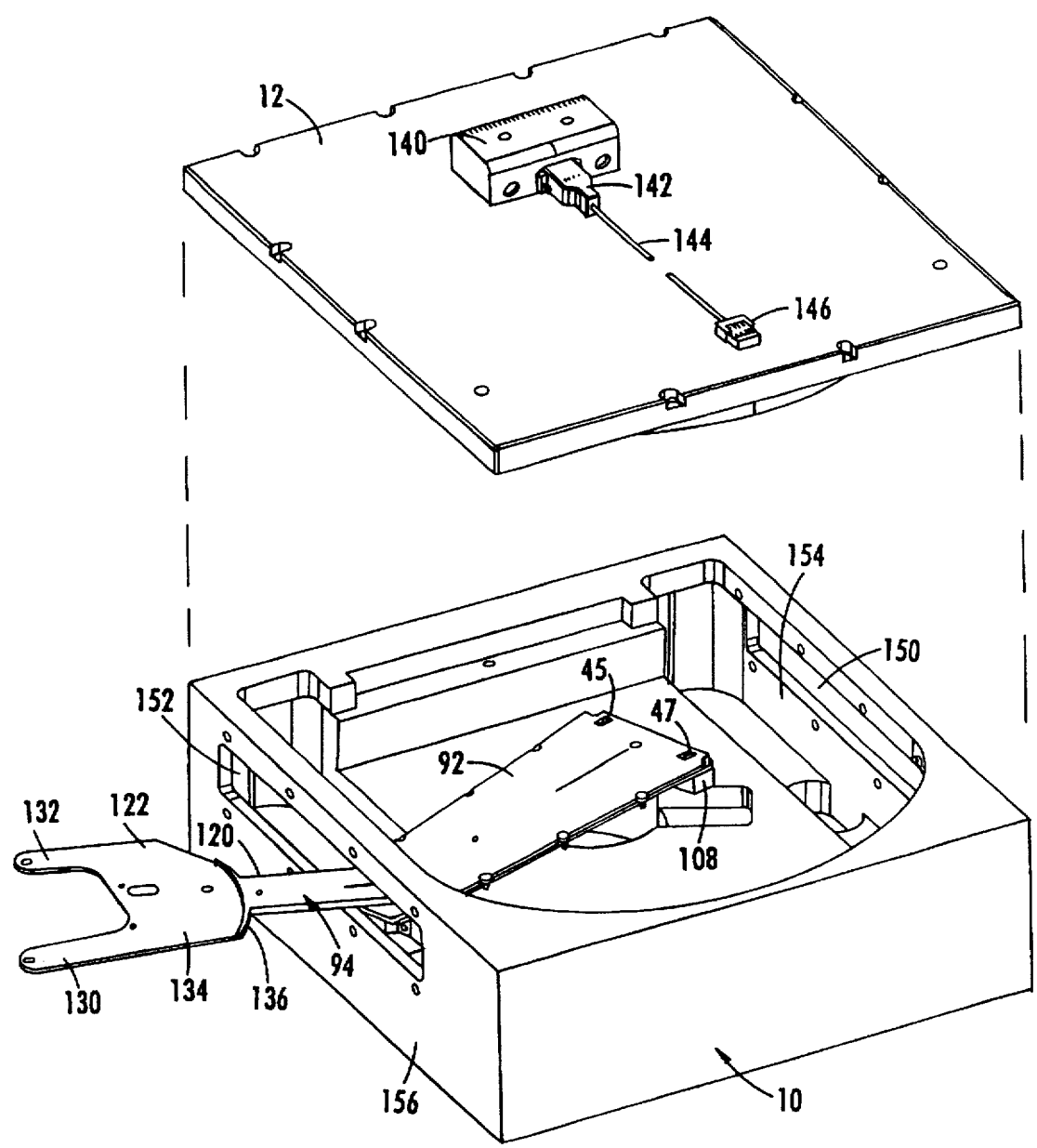

After robotic arm 90 has been rotated to the "home" position illustrated in FIG. 6 and a determination has been made that a wafer is on top arm segment 94, the shaft extending through bore 96 turns robotic arm 90, causing openings 124 and 126 of the robotic arm to be at slot 152, as illustrated in FIG. 7. Then top cover arm segment 94 is turned so tongue 120 extends through slot 152 and hand 122 extends into the cassette. The wafer is then transferred from fingers 130, 132 and web 134 on hand 122 to the cassette. Then, top arm segment 94 is turned back through slot 152 so the longitudinal axes of top and bottom segments 92 and 94 are aligned and the robotic arm moves back to the position illustrated in FIG. 5, so top segment 94 again extends through slot 150.

While there has been described and illustrated one specific embodiment of the invention, it will be clear that variations in the details of the embodiment specifically illustrated and described may be made without departing from the true spirit and scope of the invention as defined in the appended claims. For example, wafer detectors based on the principles of FIGS. 1-3 can be used in wafer processing chambers.

What is claimed is:

1. Apparatus for determining the presence and absence of a semiconductor wafer on a wafer holder in a vacuum chamber having a sealed optically transparent window comprising a source of optical energy positioned outside the chamber, a receiver for the optical energy positioned outside the chamber, a light path extending from the source through the window and through the wafer holder when no wafer is on the wafer holder, the optical path extending to the receiver through the window and being bent downstream of the wafer holder, the optical receiver being positioned and arranged so optical energy from the source reflected from a wafer in situ on the wafer holder is not incident on the optical receiver, the optical receiver thereby having optical energy from the source incident on it when no wafer is present in the wafer holder, and optical energy from the source not being incident on the receiver when a wafer is on the wafer holder.

2. The apparatus of claim 1 wherein the optical path includes first and second reflecting surfaces, the first reflecting surface being positioned to intercept optical energy from the source that propagates through the wafer holder when no wafer is present on the wafer holder and to reflect the optical energy incident thereon to the second reflecting surface, the second reflecting surface reflecting optical energy incident thereon from the first reflecting surface through the window to the optical receiver.

3. The apparatus of claim 2 wherein the first and second reflecting surfaces are positioned so the optical path extends along a line parallel to a plane including the window.

4. The apparatus of claim 3 wherein each of the optical surfaces is tilted 45° with respect to the optical energy incident thereon.

5. The apparatus of claim 4 wherein each of the reflecting surfaces is included in a prism.

6. The apparatus of claim 4 wherein each of the optical reflecting surfaces is included in a mirror.

7. The apparatus of claim 6 wherein the mirrors are positioned in a common housing fixedly positioned behind the wafer holder relative to the window.

8. The apparatus of claim 7 wherein the wafer holder includes first and second openings arranged so the optical path from the optical source to downstream of the wafer holder extends through the first opening and the optical path from downstream of the wafer holder to the receiver extends through the second opening.

9. The apparatus of claim 1 wherein the optical path includes a fiber optic transmission line having an input face positioned downstream of the wafer holder to be responsive to optical energy (a) emitted from the source, (b) propagated through the window and (c) propagated through the wafer holder; the fiber optic transmission line having an output face positioned to couple optical energy propagating through the fiber optic transmission line to the receiver via the window.

10. The apparatus of claim 1 wherein the transmitter and receiver are mounted in substantially the same plane adjacent the window.

11. The apparatus of claim 1 wherein the wafer holder includes first and second openings arranged so the optical path from the optical source to downstream of the wafer holder extends through the first opening and the optical path from downstream of the wafer holder to the receiver extends through the second opening.

12. The apparatus of claim 1 wherein the chamber is a load lock chamber including a robotic arm having a first segment for carrying the wafer and a second segment on which a portion of the optical path downstream of the wafer holder openings subsists.

13. The apparatus of claim 12 wherein the optical path includes a pair of reflecting surfaces tilted 45° with respect to the optical path extending through the wafer holder, the reflecting surfaces being fixedly mounted on the second segment of the robotic arm.

14. A method of determining the presence and absence of a semiconductor wafer on a wafer holder in a vacuum chamber including a sealed window transparent to optical energy comprising: transmitting a beam of optical energy originating outside the chamber through the window; when no wafer is on the wafer holder (a) causing the beam transmitted through the window to propagate through the wafer holder; and (b) bending the beam propagated through the wafer holder downstream of the wafer holder, and (c) causing the bent beam to propagate through the window to an optical receiver positioned outside the chamber, the optical receiver responding to the optical energy incident thereon to signal that the wafer is not present on the optical holder; when a wafer is present on the wafer holder (a) interrupting the optical energy with the wafer on the wafer holder so the beam of optical energy incident on the wafer does not propagate through the wafer holder and (b) preventing the beam of optical energy incident on the wafer from being reflected to or otherwise propagated to the optical receiver so no optical energy from the source propagates to the receiver, the optical receiver responding to the lack of optical energy of the source being incident thereon to signal that the wafer is present on the wafer holder.

15. A method of determining the presence and absence of an optically deflecting plate-like workpiece on a workpiece holder in a vacuum chamber including a sealed window transparent to optical energy comprising: transmitting a beam of optical energy originating outside the chamber through the window; when no workpiece is on the workpiece holder (a) causing the beam transmitted through the window to propagate through the workpiece holder; and (b) bending the beam propagated through the workpiece holder downstream of the workpiece holder, and (c) causing the bent beam to propagate through the window to an optical receiver positioned outside the chamber, the optical receiver responding to the optical energy incident thereon to signal that the workpiece is not present on the optical holder; when a workpiece is present on the workpiece holder (a) interrupting the optical energy with the workpiece on the workpiece holder so the beam of optical energy incident on the workpiece does not propagate through the workpiece holder and (b) preventing the beam of optical energy incident on the workpiece from being reflected to or otherwise propagated to the optical receiver so no optical energy from the source propagates to the receiver, the optical receiver responding to the lack of optical energy of the source being incident thereon to signal that the workpiece is present on the workpiece holder.

* * * * *